United States Patent
Amou et al.

(10) Patent No.: US 7,112,627 B2
(45) Date of Patent: *Sep. 26, 2006

(54) LOW DIELECTRIC LOSS TANGENT FILMS AND WIRING FILMS

(75) Inventors: Satoru Amou, Hitachi (JP); Shinji Yamada, Tsukuba (JP); Takao Ishikawa, Hitachi (JP); Akira Nagai, Hitachi (JP); Masatoshi Sugimasa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 102 days.

This patent is subject to a terminal disclaimer.

(21) Appl. No.: 10/385,720

(22) Filed: Mar. 12, 2003

(65) Prior Publication Data

US 2004/0038611 A1   Feb. 26, 2004

(30) Foreign Application Priority Data

Aug. 26, 2002   (JP) .............................. 2002-244511

(51) Int. Cl.
*C08L 9/00*   (2006.01)

(52) U.S. Cl. ...................... 524/575; 524/425; 524/430; 524/433; 525/40; 442/164

(58) Field of Classification Search ................ 524/575, 524/433, 425, 430; 525/40; 442/164
See application file for complete search history.

(56) References Cited

U.S. PATENT DOCUMENTS 4,874,826 A * 10/1989 Sakamoto et al. .......... 525/534
5,726,257 A *  3/1998 Ueda et al. ................. 525/508
6,352,782 B1 *  3/2002 Yeager et al. ............... 428/461
6,420,476 B1 *  7/2002 Yamada et al. ............. 524/575
6,500,535 B1 * 12/2002 Yamada et al. ............. 428/327
6,521,703 B1 *  2/2003 Zarnoch et al. ............. 525/17

* cited by examiner

*Primary Examiner*—Andrew T. Piziali
(74) *Attorney, Agent, or Firm*—Antonelli, Terry, Stout and Kraus, LLP.

(57) ABSTRACT

A curing low dielectric loss tangent film using a low dielectric loss tangent composition containing a polyfunctional styrene compound having excellent dielectric characteristics, and a wiring film using the same as an insulating layer are provided. The low dielectric loss tangent film contains a high molecular weight material and a crosslinking ingredient with a weight average molecular weight of 1000 or less having a plurality of styrene groups shown by the following general formula:

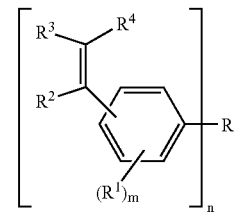

(where R represents a hydrocarbon skeleton, $R^1$, which may be identical or different with each other, represents a hydrogen atom or a hydrocarbon group of 1 to 20 carbon atoms, $R^2$, $R^3$ and $R^4$, which may be identical or different with each other, each represents a hydrogen atom or an alkyl group of 1 to 6 carbon atoms, m represents an integer of 1 to 4, and n represents an integer of 2 or greater).

20 Claims, 1 Drawing Sheet

LOW DIELECTRIC LOSS TANGENT FILMS AND WIRING FILMS

BACKGROUND OF THE INVENTION

The present invention relates to a wiring film having less dielectric loss, so as to be able to cope with high frequency signals, and to a low dielectric loss tangent film used therefor.

In recent years, the signal bands of information communication equipment, such as PHS or portable telephones, and the CPU clock times of computers, have reached the GHz level, and the working frequency in electronic devices has become higher. The dielectric loss of electric signals is in proportion to the product of the square root of a specific dielectric constant, the dielectric loss tangent of an insulator forming a circuit and the frequency of the signals being used. Accordingly, as the frequency of the signals being used is made higher, the dielectric loss increases. Since the dielectric loss attenuates electric signals, thereby to deteriorate the reliability of the signals, it is necessary to select insulators from materials having a low dielectric loss constant and a low dielectric tangent so as to suppress the loss. In order to lower the dielectric constant and lower the dielectric loss tangent of an insulator, it is effective to remove polar groups in the molecular structure; and, for this purpose, the use of fluoro resin, curable polyolefin, cyanate ester type resin, curable polyphenylene oxide, allyl modified polyphenylene ether, or divinyl benzene or divinyl naphthalene-modified polyether imide have been proposed. For example, fluoro resins, typically represented by polytetrafluoroethylene (PTFE), have a low dielectric constant and a low dielectric loss tangent, and so they are typically used for substrate materials handling high frequency signals. While, on the other hand, various non-fluoro resins having a low dielectric constant and a low dielectric loss tangent which are soluble to organic solvents and can be handled easily, have also been studied. They include various materials, for example, dienic polymers, such as polybutadiene impregnated into glass cloth and cured by peroxides, as disclosed in Japanese Patent Laid-open No. 8-208856; cyclic polyolefins provided with curability by introducing epoxy groups into a norbornene series addition type polymer, as disclosed in Japanese Patent Laid-open No. 10-158337; cyanate ester, dienic polymer and epoxy resin heated into the B stage, as disclosed in Japanese Patent Laid-open No. 11-124491; modified resins, including polyphenylene oxide, dienic polymer and triallyl isocyanate, as disclosed in Japanese Patent Laid-open No. 9-118759; resin compositions comprising, for example, allylated polyphenylene ether and triallylisocyanate, as disclosed in Japanese Patent Laid-Open Hei 9-246429; polyetherimide alloyed with styrene, divinyl benzene or divinyl naphthalene, as disclosed in Japanese Patent Laid-open No. 5-156159; and resin compositions comprising, for example, hydroquinone bis(vinyl benzyl) ether and novolac phenol resin synthesized from dihydroxy compound and chloromethyl styrene by Williamson synthesis, as disclosed in Japanese Patent Laid-open No. 5-78552.

However, even the materials of low dielectric constant and low dielectric loss tangent, as described above, do not have sufficient dielectric characteristics to cope with the high frequency equipment which is expected in the future.

SUMMARY OF THE INVENTION

It is an object of the present invention to provide a low dielectric loss tangent film, using a low dielectric loss tangent resin composition containing a polyfunctional styrene compound having excellent dielectric characteristics, as compared to existent materials, and to a wiring film using the same.

A curing product of a polyfunctional styrene compound has an extremely low dielectric constant and dielectric loss tangent; for example, the dielectric constant thereof is about 2.5, and the dielectric tangent is less than 0.002 at a measuring frequency of 10 GHz.

As a result of various studies in an effort to provide a polyfunctional styrene compound with a film forming property, a low dielectric loss tangent film containing a high molecular weight material and a polyfunctional styrene compound has been developed. The low dielectric loss tangent film can be provided with characteristics, such as high strength and low heat expansion, by using it in combination with other organic films, organic cloths and organic non-woven fabrics. Since the low dielectric loss tangent film according to the present invention has curability, it constitutes a low dielectric loss tangent film that has an excellent heat stability and chemical resistance. The low dielectric loss tangent film can be utilized as an insulation layer, such as for flexible wiring substrates. Since the wiring film prepared with the low dielectric loss tangent film according to the present invention has a low dielectric constant and dielectric loss tangent loss, it has an excellent transmission property for high frequency signals; and, since the film is reduced in weight, it is suitable for use as wiring materials in small sized, lightweight electronic equipment.

An example a low dielectric loss tangent film and a wiring film according to the present invention will be described.

A low dielectric loss tangent film according to the present invention is formed basically by preparing a film from a low dielectric loss tangent resin composition containing a crosslinking ingredient with a weight average molecular weight of 1000 or less and having plural styrene groups represented by the following general formula:

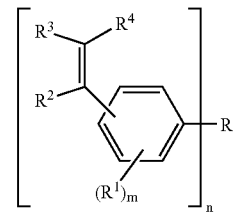

(where R represents a hydrocarbon skeleton which may have a substituent, $R^1$, which may be identical or different from each other, and represents a hydrogen atom or a hydrocarbon group of 1 to 20 carbon atoms; $R^2$, $R^3$ and $R^4$, which may be identical or different with each other, each of which represents a hydrogen atom or a hydrocarbon group of 1 to 6 carbon atoms; $R^5$, $R^6$, $R^7$ and $R^8$, which may be identical or different with each other, each of which represents a hydrogen atom or a hydrocarbon group of 1 to 20 carbon atoms; and n represents an integer of 2 or greater), and a high molecular weight of material with a weight average molecular weight 5000 or more.

In accordance with the present invention, a curable low dielectric loss tangent film having an extremely low dielectric constant and a low dielectric loss tangent can be prepared by using a polyfunctional styrene compound not containing polar groups as a crosslinking ingredient. Since this crosslinking ingredient has no volatility, such as is found in divinyl benzene, that has been used so far as the crosslinking ingredient in the existent materials, the crosslinking ingredient does not evaporate out of the film during preparation and storage of the low dielectric loss tangent film, with the result that the resin compositional ratio is less changed with time. That is, by the use of this crosslinking ingredient, a low dielectric loss tangent film having excellent dielectric characteristics can be manufactured simply and stably. The weight average molecular weight of the crosslinking ingredient (GPC, styrene converted value) is preferably 1000 or less. This can lower the melting temperature of the crosslinking ingredient, improve the flowability thereof upon molding, lower the curing temperature, and improve the compatibility with various polymers, monomers and fillers, thereby producing a low dielectric loss tangent film of easy fabricability. Preferred examples of the crosslinking ingredient can include 1,2-bis(p-vinylphenyl)ethane, 1,2-bis(m-vinylphenyl)ethane, 1-(p-vinylphenyl)-2-(m-vinylphenyl)ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-3-(m-vinylphenylethyl)benzene, bisvinylphenylmethane, 1,6-(visvinylphenyl)hexane and vinylbenzene polymer (olygomer) having vinyl groups on the side chain.

In accordance with the present invention, the desired film forming property can be provided and an insulating film having an excellent strength, elongation, and adhesion to conductor wiring can be obtained by dispersing high molecular weight material into the low dielectric loss tangent crosslinking ingredient. The molecular weight of the high molecular weight material is preferably 5000 or more, more preferably, 10,000 to 100,000, and, more preferably, 15,000 to 60,000. When the molecular weight is lower, the mechanical strength is sometimes insufficient; and, on the other hand, when the molecular weight is excessively high, the viscosity increases when the low dielectric loss tangent resin composition is formed into varnish, so that sometimes the fabricability, such as in mixing and stirring, film deposition and impregnation is deteriorated. Examples of the high molecular weight material can include, homo- or co-polymers of monomers selected from butadiene, isoprene, styrene, ethylstyrene, dibinylbenzene, N-vinylphenyl maleimide, acrylic acid ester, and acrylonitrile, and polyphenylene oxide, polyqyinoline, cyclic polyolefin, polysiloxane and polyether imide, which may have a substituent. Among them, polyphenylene oxide and cyclic polyolefin are preferred from the viewpoint of the strength and the low dielectric loss tangent. The high molecular weight materials described above may be used also as a composite. Since the low dielectric loss tangent film often loses its self-standing property when the content of the crosslinking ingredient exceeds 50 wt %, it is preferable to coat and dry a low dielectric loss tangent resin composition varnish to form a film on a support such as a releasing film or a conductor foil that is used for formation of conductor wiring, and to use the same from the viewpoint of ensuring the fabricability.

The dielectric loss tangent, after curing the low dielectric loss tangent film of the invention, can be lowered to an extremely small value, such as 0.001 to 0.005 at 10 GHz, depending on the kind and the blending amount of the high molecular weight material to be blended. For example, in the curing product of the low dielectric loss tangent film, in which a polyphenylene oxide is blended, for example, as the high molecular weight material, the dielectric loss tangent at 10 GHz can be lowered to less than 0.002.

In accordance with the present invention, the not-cured low dielectric loss tangent film can be provided with a self-standing property by compositing the crosslinking ingredient and the high molecular weight material with an organic film, organic cloth or organic non-woven fabric, not depending on the kind and the compositional ratio of the crosslinking ingredient and the high molecular weight material. Self-standing films are easy to handle and convenient for various kinds of fabrication. The organic films, cloths or non-woven fabrics have a lower dielectric constant and reduced weight compared with glass type cloths or non-woven fabrics. With a viewpoint toward the factors described above, this is preferable as the wiring material for small-sized, lightweight, high frequency electronic equipment.

The composite low dielectric loss tangent film can be prepared easily by coating or impregnating a varnish of low dielectric loss tangent resin composition on an organic film, an organic cloth or organic non-woven fabric, followed by drying. In this case, the organic film, organic cloth or organic non-woven fabric may be previously subjected to a treatment, such as surface roughening or a coupling treatment, with the objective of improving the adhesion with the low dielectric loss tangent resin composition. The composite type low dielectric loss tangent film incorporates any one of an organic film, organic cloth and organic non-woven fabric in the film after curing. Therefore, the heat expansion coefficient of the low dielectric loss tangent film comes under the effect of the organic film, organic cloth or organic non-woven fabric incorporated therein; and, for example, the heat expansion coefficient of the low dielectric loss tangent film can be lowered by properly selecting a material with a heat expansion coefficient of 20 ppm/°C. as the organic film, organic cloth and the organic non-woven fabric. Preferred examples of polymers forming the organic film, organic cloth and organic non-woven fabric can include polyimide, aramide, polybenzoxazole and polyphenyne sulfide.

While there is no particular restriction on the amount of the crosslinking ingredient and the high molecular weight material to be added in the low dielectric loss tangent resin composition contained in the low dielectric loss tangent film of the invention, it is preferred to add the crosslinking ingredient within a range of 5 to 95 parts by weight and the high molecular weight material within a range of 95 to 5 parts by weight. The composition can be controlled within the range described above in accordance with the desired purpose, such as an improvement in the film forming property, the strength, the elongation or the adhesion. Further, the blending ratio for composition of the low dielectric loss tangent resin composition and the organic film, organic cloth and organic non-woven fabric can be selected optionally in accordance with the required expansion coefficient.

The organic solvent for making a varnish of the low dielectric loss tangent resin composition has no particular restriction, so long as the solvent can dissolve the crosslinking ingredient and the high molecular weight material. Examples of such an organic solvent include ketones, such as acetone, methyl ethyl ketone, and methyl isobutyl ketone; aromatic hydrocarbons, such as toluene and xylene; amides, such as N,N-dimethylformamide; and N,N-dimethylacetoamide; ethers, such as diethyl ether, ethylene glycol monomethyl ether, propylene glycol monomethyl ether, tetrahydrofuran, and dioxane; and alcohols, such as methanol, ethanol, and isopropanol. The organic solvents may be added solely, or two or more of them may be used in admixture.

While the low dielectric loss tangent film of the present invention can be cured merely by heating, without adding a curing catalyst, a curing catalyst capable of polymerizing styrene groups can be added for the purpose of improving the curing efficiency. There is no particular restriction on the amount to be added; but, since the residue of the curing catalyst may possibly cause undesired effects on the dielectric characteristic, the amount is desirably from 0.0005 to 10 parts by weight, based on 100 parts by weight of the total for the crosslinking ingredient and the high molecular weight material. When the curing catalyst is added within the range described above, a polymerizing reaction for the styrene groups is promoted, and a firm curing product can be obtained at a low temperature. Examples of curing catalysts forming cations or radical active species that are capable of initiating polymerization of styrene groups by heat or light are described below. A cationic polymerization initiator can include diallyl iodonium salt, trially sulfonium salt and aliphatic sulfonium salt, having $BF_4$, $PF_6$, $AsF_6$ and $SbF_6$ as a pair anion, and commercial products, such as SP-70, 172, and CP-66 manufactured by ASAHI DENKA INDUSTRY CO., LTD., CI-2855 and 2823 manufactured by NIPPON SODA CO., LTD., SI-100L and SI-150L manufactured SANSHIN CHEMICAL INDUSTRY CO., LTD., can be used. Examples of the radical polymerization initiator can include benzoin compounds, such as benzoin and benzoin-methyl; acetophenone compounds, such as acetophenone and 2,2-dimethoxy-2-phenylacetophenone; thioxanthone compounds, such as thioxanthone and 2,4-diethylthioxanthone; bisazide compounds, such as 4,4'-diazidochalcone, 2,6-bis(4'-azidobenzal)cyclohexanone, and 4,4'-diazidobenzophenone; azo compounds, such as azobisbutylonitrile, 2,2-azobispropane, m,m'-azoxystyrene, and hydrazone; as well as organic peroxides, such as 2,5-dimethyl-2,5-di(t-butylperoxy)hexane and 2,5-dimethyl-2,5-di(t-butylperoxy)hexine-3, dicumylperoxide. In particular, it is preferred to add an organic peroxide or bisazide compound which causes extraction of hydrogen of a compound not having functional groups and which brings about crosslinking between the crosslinking ingredient and the high molecular weight material.

In the low dielectric loss tangent film of the invention, a polymerization inhibitor may also be added to enhance the storage stability during a not-curing stage. The amount to be added is preferably within such a range as to not remarkably deteriorate the dielectric characteristics and the reactivity during curing; and, it is preferably from 0.0005 to 5 parts by weight based on 100 parts by weight of the total for the crosslinking ingredient and the high molecular weight material. When the polymerization inhibitor is added in an amount within the range described above, an excessive crosslinking reaction during storage can be suppressed, and no remarkable hindrance to curing is brought about during curing. Examples of the polymerization inhibitor include quinines, such as hydroquinone, p-benzoquinone, chloranyl, trimethylquinone, and 4-t-butylpyrocatechol, and aromatic diols.

The drying condition and the curing condition upon preparation of the low dielectric loss tangent film of the invention depend on the solvent being used for forming the varnish; for example, preferably, the drying condition, in a case of using toluene for the solvent, is at 80 to 120° C. for about 30 to 90 min. In a case of subsequent lamination to bond a conductor foil and a low dielectric loss tangent film by pressing, the adhesion and curing are preferably performed within a range of 150 to 180° C. for 1 to 3 hours, under a pressure of 1 to 5 MPa. In a case of bonding the low dielectric loss tangent film and the conductor film by use of the lamination method, it is preferred to fuse the copper foil and the low dielectric loss tangent film by heating at about 100° C. and, subsequently, heating at 150 to 180° C., depending on the composition of the low dielectric loss tangent resin composition.

BRIEF DESCRIPTION OF THE DRAWINGS

Other objects and advantages of the invention will become apparent from the following description of various embodiments, with reference to the accompanying drawing, in which.

DETAILED DESCRIPTION OF THE PREFERRED EMBODIMENTS

Figure 1A:
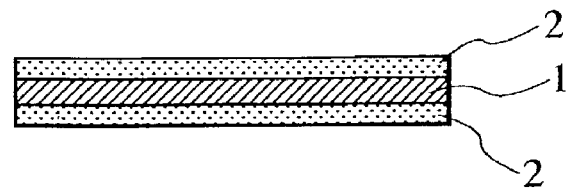
FIGS. 1A to 1F are schematic views showing an example of the processing employed in the preparation of a wiring film, as well as a multi-layered wiring film.

The present invention will be explained more specifically with reference to examples and comparative examples, but the invention is not restricted to such examples. Unless otherwise specified, the term "parts" in the following description means parts by weight.

The names of reagents, a synthesis method, a method preparation of varnish, and evaluation methods for curing products used for examples and comparative examples will be described.

(1) Synthesis of 1,2-bis(vinylphenyl)ethane (BVPE)

1,2-bis(vinylphenyl)ethane (BVPE) was synthesized by a known method, as described below. Granular magnesium for a Grignard reaction (manufactured by KANTO KAGAKU Co., LTD.) having a weight of 5.36 g (220 mmol) was taken into a 500 ml three-necked flask, to which were attached a dropping funnel, a nitrogen introduction tube and a septum cap. Under a nitrogen gas stream, the entire system was heated and dewatered by a drier while stirring magnesium particles with a stirrer. Dry tetrahydrofuran, having a volume of 300 ml, was taken in a syringe and injected through the septum cap. After cooling the solution to −5° C., 30.5 g (200 mmol) of vinylbenzyl chloride (VBC, manufactured by TOKYO KASEI KOGYO CO., LTD.) was dropped for about 4 hours using the dropping funnel. After the end of the dropping, stirring was continued at 0° C. for 20 hrs. After the completion of the reaction, the reaction solution was filtered to remove the residual magnesium, and then the filtrate was concentrated by an evaporator. The concentrated solution was diluted with hexane and washed once with an aqueous 3.6% solution of hydrochloric acid and three times with purified water, and then it was dehydrated by magnesium sulfate. The dewatered solution was purified by passing it through a silica gel (Wako Gel C300, manufactured by Wako Pure Chemical Industries, Ltd.)/hexane short column and dried under vacuum conditions to obtain BVPE. The obtained BVPE was a mixture of m—m form (liquid), m-p form (liquid), and p—p form (crystal), and the yield was 90%. When the structure was examined by $^1$H-NMR, the values agreed with the literature values (6H-vinyl: α-2H, 6.7, β-4H, 5.7, 5.2; 8H-aromatic: 7.1–7.35: 4H-methylene: 2.9).

BVPE, as described above, was used as a crosslinking ingredient.

(2) Other Reagents

The following were used as other constituent materials.

High Molecular Weight Material:
  PPO: poly-2,6-dimethyl-1,4-phenyleneoxide, manufactured by Sigma-Aldrich Co.
  Polyquinoline: PQ100, manufactured by Hitachi Chemical Co., Ltd.

Curing Catalyst:
  25B: 2,5-dimethyl-2,5-bis(t-butylperoxy)hexine-3 (perhexine 25B), manufactured by NOF Corporation Composite Material;
  Alamide non-woven fabric, Thermount E210 (about 50 µm in thickness, about 19 mm/° C. in heat expansion coefficient), manufactured by Dupont,
  Polyphenylene sulfide film, Torerina (about 25 µm in thickness, about 30 ppm/° C. in heat expansion coefficient), manufactured by Toray Industries, Inc.

(3) Method of Preparation of Varnish

Varnish of a resin composition was prepared by dissolving a predetermined amount of high molecular weight material, a crosslinking ingredient and a curing catalyst in chloroform.

(4) Preparation of a Cured Insulating Film

After coating the organic film and the non-woven fabric with the varnish and drying them in a nitrogen gas stream at 80° C. for 60 min, the low dielectric loss tangent film and a copper foil were stacked relative to each other and heated and pressed by way of a polyimide film and a mirror plate under vacuum condition to prepare an insulating film with a copper film being used as a curing product. Multi-stage heating was conducted under the heating conditions of 120° C. for 30 min, 150° C. for 30 min, 180° C. for 100 min, under a pressure of 1.5 MPa by a press. The film measured about 150×70×0.05 mm.

(5) Measurement of Dielectric Constant and Dielectric Loss Tangent

The dielectric coefficient and the dielectric loss tangent were observed by values at 10 GHz using a cavity resonation method (Model 8722ES network analyzer manufactured by Agilent Technologies, cavity resonator, manufactured by KANTOH EAD INC). Specimens for measurement were prepared by removing the copper foil from the low dielectric loss tangent film with copper film by etching, and the specimens were cut out to 80×2 mm in size.

(6) Measurement of the Heat Expansion Coefficient

For the heat expansion coefficient, a α1 value was determined by using a thermo-mechanical analyzer TM-7000 manufactured by ULVAC-RIKO Inc. Specimens for measurement were prepared by removing the copper foil of the low dielectric loss tangent film with a copper film by etching, and the specimens were cut out to 30×2 mm in size. Measurement was conducted under the conditions of an inter-support point distance of 20 mm, a temperature elevation rate of 2° C./min and a tensile weight of 2 gf.

COMPARATIVE EXAMPLE 1

Comparative Example 1 is an example of a low dielectric loss tangent film with copper foil prepared by dissolving polyphenylene oxide (PPO) in chloroform and coating and drying the solution on a copper foil. While the low dielectric loss tangent film of Comparative Example 1 had excellent dielectric characteristics, with a dielectric constant of about 2.4 and a dielectric loss tangent of about 0.0022, it was swollen and dissolved in toluene. Further, the heat expansion coefficient exhibited a relatively high value of 60 ppm/° C. When two sheets of the low dielectric loss tangent films of Comparative Example 1 were stacked relative to each other and pressed at a pressure of 1.5 MPa, they were not fused and could not be formed into a multi-layered structure by heating at 180° C. To form a multi-layered structure, pressing at 280° C. or higher was necessary. This is because the melting point of polyphenylene oxide is high.

EXAMPLE 1

Example 1 is directed to the use of PQ100 as a high molecular weight material and BVPE as a crosslinking ingredient. The low dielectric loss tangent film of Example 1 is a self-standing film. When the film was sandwiched between copper foils and pressed at a pressure of 1.5 MPa, it was fused to the copper foils in the course of temperature elevation to a heating temperature of 180° C. Subsequently, heating was continued for 100 min to effect curing. The cured low dielectric loss tangent film was taken out by use of an etching treatment. It was formed that the low dielectric loss tangent film formed in this way was not dissolved and swollen in toluene and was stable. Further, the low dielectric loss tangent film exhibited a dielectric constant as low as 2.65 and a dielectric loss tangent as low as 0.005. The heat expansion coefficient was 55 ppm/° C.

EXAMPLE 2

Example 2 is directed to the use of PQ100 as a high molecular weight material and BVPE as a crosslinking ingredient. The low dielectric loss tangent film of Example 2 is not a self-standing film. The film was prepared by coating and drying on a copper foil. When two sheets of the films with copper foils were stacked relative to each and pressed at a pressure of 1.5 MPa, they were fused to the copper foils in the course of temperature elevation to a heating temperature of 180° C. Subsequently, heating was continued for 100 min to effect curing. The cured low dielectric loss tangent film was taken out by use of an etching treatment. It was formed that the low dielectric loss tangent film formed in this way was not dissolved and swollen in toluene and was stable. Further, the low dielectric loss tangent film exhibited a dielectric constant as low as 2.43 and a dielectric loss tangent as low as 0.0018. The heat expansion coefficient was 60 ppm/° C.

EXAMPLE 3

Example 3 is directed to the use of polyphenylene oxide (PPO) as a high molecular weight material, BVPE as a crosslinking ingredient and Torelina as an organic film. The surface of the organic film was roughened by sand paper. The unevenness on the film surface after roughening was about 5 µm. Subsequently, the organic film was immersed in a varnish of a low dielectric loss tangent resin composition and dried to obtain a composited low dielectric loss tangent film. The low dielectric loss tangent film of Example 3 is a self-standing film, in which about 100 parts of low dielectric loss tangent resin composition was coated, based on 100 parts by weight of the organic film. When the film was sandwiched between copper foils and pressed at a pressure of 1.5 MPa, it was fused to the copper foils in the course of temperature elevation to a heating temperature of 180° C. Subsequently, heating was continued for 100 min to effect curing. The cured low dielectric loss tangent film was taken out by an etching treatment. It was found that the low dielectric loss tangent film formed in this way was not dissolved and swollen in toluene and was stable. Further, the low dielectric loss tangent film exhibited a dielectric constant as low as 2.70 and a dielectric loss tangent as low as 0.0025. The heat expansion coefficient was lowered to 43 ppm/° C. by composition.

EXAMPLE 4

Example 4 is directed to the use of polyphenylene oxide (PPO) as a high molecular weight material, BVPE as a crosslinking ingredient and E210 as an organic non-woven fabric. The organic non-woven fabric was impregnated with the low dielectric loss tangent resin composition to obtain a low dielectric loss tangent film. The impregnation amount of the low dielectric loss tangent resin composition of the film was about 100 parts based on 100 parts by weight of the E210. When the low dielectric loss tangent film was sandwiched between copper foils and pressed at a pressure of 1.5 MPa, it was fused to the copper foils in the course of temperature elevation to a heating temperature of 180° C. Subsequently, heating was continued for 100 min to effect curing. The cured low dielectric loss tangent film was taken out by an etching treatment. It was formed that the low dielectric loss tangent film formed in this way was not dissolved and swollen in toluene and was stable. Further, the low dielectric loss tangent film exhibited a dielectric constant as low as 2.75 and a dielectric loss tangent as low as 0.0025. The heat expansion coefficient was lowered to 36 ppm/° C. by composition.

TABLE 1

|  |  | Comp. Example 1 | Example 1 | Example 2 | Example 3 | Example 4 |
|---|---|---|---|---|---|---|
| BVPE |  | 0 | 50 | 50 | 50 | 50 |
| PPE |  | 100 | 0 | 50 | 50 | 50 |
| PQ |  | 0 | 50 | 0 | 0 | 0 |
| 25B |  | 0 | 1 | 1 | 1 | 1 |
| Composite material | Torelina | 0 | 0 | 0 | 100 | 0 |
|  | E210 | 0 | 0 | 0 | 0 | 100 |
| Dielectric constant (10 GHz) |  | 2.40 | 2.65 | 2.43 | 2.70 | 2.75 |
| Dielectric loss tangent (10 GHz) |  | 0.0022 | 0.0050 | 0.0018 | 0.0025 | 0.0025 |
| Heat expansion coefficient (ppm/° C.) |  | 60 | 55 | 60 | 43 | 36 |
| Molding temperature (° C.) |  | 300 | 180 | 180 | 180 | 180 |

EXAMPLE 5

Examples of the processing used in preparing a wiring film and a multi-layered wiring film will be described with reference to FIGS. 1A to 1F.

FIG. 1A: A low dielectric loss tangent film 1 having copper foils 2 on opposite surfaces was prepared in the same manner as in Example 4.

Figure 1B:
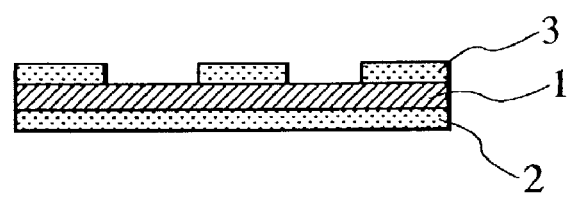

FIG. 1B: Wiring 3 was formed on the copper foil by etching. A flexible wiring board was prepared as described above.

An example of multi-layering will be considered.

Figure 1C:
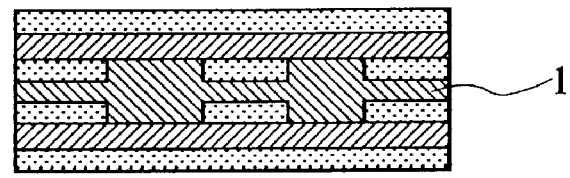

FIG. 1C: Two sheets of flexible wiring boards were laminated by way of a not-yet-cured dielectric loss tangent film corresponding to Example 4, and this assembly was cured by heating and pressing to form a multi-layered structure.

Figure 1D:
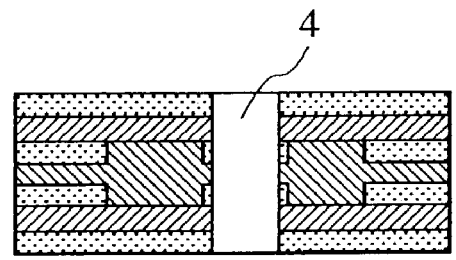

FIG. 1D: A through hole was bored by drilling at a predetermined position.

Figure 1E:
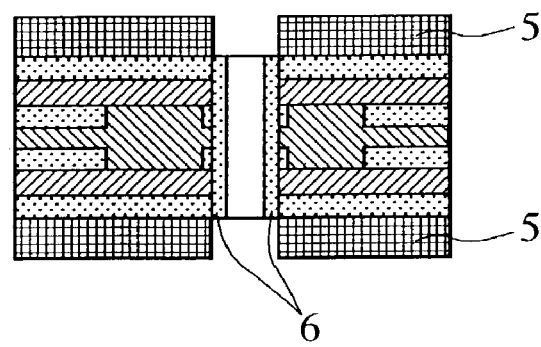

FIG. 1E: A plating resist 5, having an opening, was formed just above the through hole, and plating copper 6 was formed in the through hole using electroless plating and electrolytic plating together.

Figure 1F:
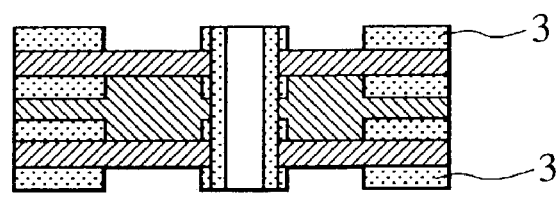

FIG. 1F: After first removing the plating resist, an outer layer wiring was formed by the usual etching to prepare a flexible multi-layered assembly. Since the insulating film is formed by a low dielectric constant and low dielectric loss tangent material, the transmission loss in the flexible wiring board is low. According to the present invention, a low dielectric loss tangent film having a low dielectric constant and a low dielectric loss tangent is obtained. The low dielectric loss tangent film can be used suitably to form an insulating layer of a flexible wiring film.

While the invention has been described in relation to its preferred embodiments, it is to be understood that the words which have been used are words of description rather than limitation and that changes within the purview of the appended claims may be made without departing from the true scope and spirit of the invention in its broader aspects.

What is claimed is:

1. A curing low dielectric loss tangent film containing a crosslinking ingredient with a weight average molecular weight of 1000 or less having a plurality of styrene groups shown by the following general formula:

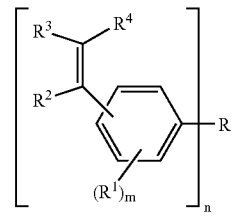

(where R represents a hydrocarbon skeleton, $R^1$, which may be identical or different with each other, represents a hydrogen atom or a hydrocarbon group of 1 to 20 carbon atoms, $R^2$, $R^3$ and $R^4$, which may be identical or different with each other, each represents a hydrogen atom or an alkyl group of 1 to 6 carbon atoms, m represents an integer of 1 to 4, and n represents an integer of 2 or greater), and a high molecular weight material with a weight average molecular weight of 5000 or more.

2. A low dielectric loss tangent film as defined in claim 1, wherein the dielectric loss tangent at 10 GHz after curing of the low dielectric loss tangent film is from 0.001 to 0.005.

3. A low dielectric loss tangent film as defined in claim 1, wherein the low dielectric loss tangent film is a composite material with other organic film, organic cloth or organic non-woven fabric.

4. A low dielectric loss tangent film as defined in claim 3, wherein the heat expansion coefficient of the organic film, organic cloth or organic non-woven fabric is 20 ppm/° C. or less.

5. A low dielectric loss tangent film as defined in claim 4, wherein the organic film, organic cloth or organic non-woven fabric has one of polyimide, aramide, polybenzoxazole and polyphenylene sulfide as a constituent ingredient.

6. A low dielectric loss tangent film as defined in claim 1, wherein the high molecular weight material is at least one resin selected from the group consisting of a polymer comprising at least one of butadiene, isoprene, methyl styrene, styrene, ethyl styrene, divinyl benzene, acrylic acid ester, acrylonitrile, N-phenylmaleimide and N-vinylphenyl maleimide, and polyphenylene oxide which may have a substituent, polyquinoline and polyolefin having cycloaliphatic structure.

7. A low dielectric loss tangent film as defined in claim 1, wherein the low dielectric loss tangent film contains phenol resin, epoxy resin, cyanate resin, vinyl benzyl ether resin or thermosetting polyphenylene ether resin as a second crosslinking ingredient.

8. A low dielectric loss tangent film as defined in claim 1, wherein a conductor layer is provided on at least one of the surfaces of the low dielectric loss tangent film.

9. A low dielectric loss tangent film which is a curing product of a resin composition containing a crosslinking ingredient with a weight average molecular weight of 1000 or less having a plurality of styrene groups shown by the following general formula:

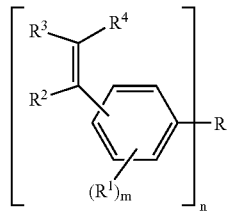

(where R represents a hydrocarbon skeleton, $R^1$, which may be identical or different with each other, represents a hydrogen atom or a hydrocarbon group of 1 to 20 carbon atoms, $R^2$, $R^3$ and $R^4$, which may be identical or different with each other, each represents a hydrogen atom or an alkyl group of 1 to 6 carbon atoms, m represents an integer of 1 to 4, and n represents an integer of 2 or greater), and a high molecular weight material with a weight average molecular weight of 5000 or more.

10. A low dielectric loss tangent film as defined in claim 9, wherein the low dielectric loss tangent film is a composite material with other organic film, organic cloth or organic non-woven fabric.

11. A low dielectric loss tangent film as defined in claim 10, wherein the heat expansion coefficient of the organic film, organic cloth or organic non-woven fabric is 20 ppm/° C. or less.

12. A low dielectric loss tangent film as defined in claim 11, wherein the organic film, organic cloth or organic non-woven fabric has one of polyimide, aramide, polybenzoxazole and polyphenylene sulfide as a constituent ingredient.

13. A wiring film having a wiring layer and an insulating layer constituted with a low dielectric loss tangent film which is a curing product of a resin composition containing a crosslinking ingredient with a weight average molecular weight of 1000 or less having a plurality of styrene groups shown by the following general formula:

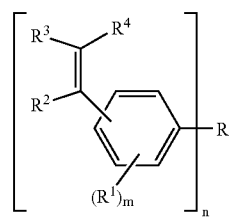

(where R represents a hydrocarbon, skeleton, $R^1$, which may be identical or different with each other, represents a hydrogen atom or a hydrocarbon group of 1 to 20 carbon atoms, $R^2$, $R^3$ and $R^4$, which may be identical or different with each other, each represents a hydrogen atom or an alkyl group of 1 to 6 carbon atoms, m represents an integer of 1 to 4, and n represents an integer of 2 or greater), and a high molecular weight material with a weight average molecular weight of 5000 or more.

14. A wiring film as defined in claim 13, wherein the low dielectric loss tangent film is a composite material with other organic film, organic cloth or organic non-woven fabric.

15. A wiring film as defined in claim 13, wherein the insulating layer and the wiring layer are stacked by two or more layers.

16. A low dielectric loss tangent film as defined in claim 1, wherein said crosslinking ingredient has a weight average molecular weight of less than 1000.

17. A low dielectric loss tangent film as defined in claim 1, wherein said high molecular weight material has a weight average molecular weight in a range of 10,000 to 100,000.

18. A low dielectric loss tangent film as defined in claim 1, including 5 to 95 parts by weight of said crosslinking ingredient and 95 to 5 parts by weight of said high molecular weight material.

19. A low dielectric loss tangent film as defined in claim 9, wherein said crosslinking ingredient has a weight average molecular weight of less than 1000.

20. A wiring film as defined in claim 13, wherein said crosslinking ingredient has a weight average molecular weight of less than 1000.

* * * * *